United States Patent
Choi et al.

(10) Patent No.: US 10,487,396 B2
(45) Date of Patent: Nov. 26, 2019

(54) DIAMOND ELECTRODE AND METHOD OF MANUFACTURING THE SAME

(71) Applicant: TECHWIN CO., LTD., Cheongju-si Chungcheongbuk-do (KR)

(72) Inventors: Yong-sun Choi, Pohang-si (KR); You-kee Lee, Pohang-si (KR); Chi-bok Han, Changwon-si (KR)

(73) Assignee: TECHWIN CO., LTD., Cheongju-si, Chungcheongbuk-do (KR)

( * ) Notice: Subject to any disclaimer, the term of this patent is extended or adjusted under 35 U.S.C. 154(b) by 0 days.

(21) Appl. No.: 14/718,067

(22) Filed: May 20, 2015

(65) Prior Publication Data

US 2015/0345011 A1 Dec. 3, 2015

(30) Foreign Application Priority Data

May 29, 2014 (KR) ........................ 10-2014-0065404

(51) Int. Cl.
*C23C 16/27* (2006.01)
*C02F 1/461* (2006.01)
*C02F 1/467* (2006.01)

(52) U.S. Cl.
CPC ........ *C23C 16/271* (2013.01); *C02F 1/46109* (2013.01); *C23C 16/278* (2013.01); *C23C 16/279* (2013.01); *C02F 1/4672* (2013.01); *C02F 2001/46147* (2013.01)

(58) Field of Classification Search
None
See application file for complete search history.

(56) References Cited

U.S. PATENT DOCUMENTS

| | | | |
|---|---|---|---|
| 7,273,536 B2 * | 9/2007 | Shibata | C23C 16/02 204/280 |
| 2003/0131787 A1 * | 7/2003 | Linares | C30B 25/02 117/93 |
| 2006/0029830 A1 * | 2/2006 | Yoon | B82Y 30/00 428/697 |

(Continued)

FOREIGN PATENT DOCUMENTS

| | | |
|---|---|---|
| JP | 60-021232 B2 | 11/1982 |
| JP | 2761751 B2 | 6/1998 |

(Continued)

*Primary Examiner* — Mandy C Louie
(74) *Attorney, Agent, or Firm* — Rabin & Berdo, P.C.

(57) ABSTRACT

Disclosed are a method of manufacturing a diamond electrode by a chemical vapor deposition (CVD) process, and a diamond electrode manufactured by the method. The method of manufacturing the diamond electrode includes: introducing a carbon source gas to form niobium carbide (NbC) on a niobium substrate, immediately before depositing an electrically conductive diamond layer on the substrate by a hot-filament chemical vapor deposition (HFCVD) process; and depositing electrically conductive diamond layers on the substrate by two or more separate processes. Accordingly, a pinhole present during deposition of the electrically conductive diamond layer is filled such that the contact between an electrolyte and the substrate in an electrolytic environment will be minimized so as to retard the corrosion of the substrate, thereby providing a diamond electrode having a long life span.

4 Claims, 2 Drawing Sheets

(56) References Cited

U.S. PATENT DOCUMENTS

| | | | |
|---|---|---|---|
| 2006/0066203 A1* | 3/2006 | Uno | C02F 1/46109 |
| | | | 313/311 |
| 2006/0144702 A1* | 7/2006 | Seki | C02F 1/46109 |
| | | | 204/280 |
| 2007/0031694 A1* | 2/2007 | Hosonuma | C02F 1/46109 |
| | | | 428/621 |
| 2008/0070049 A1* | 3/2008 | Guo | C23C 16/0272 |
| | | | 428/457 |
| 2008/0233838 A1* | 9/2008 | Mase | B24C 1/06 |
| | | | 451/38 |
| 2008/0268150 A1* | 10/2008 | Fujimura | C23C 16/0272 |
| | | | 427/249.14 |
| 2008/0286541 A1* | 11/2008 | Zeisler | C04B 35/52 |
| | | | 428/213 |
| 2009/0017258 A1* | 1/2009 | Carlisle | C23C 16/271 |
| | | | 428/143 |
| 2009/0246410 A1 | 10/2009 | Cao et al. | |
| 2009/0324810 A1* | 12/2009 | Serikawa | C02F 1/46109 |
| | | | 427/78 |
| 2011/0247929 A1* | 10/2011 | Nagai | C02F 1/46109 |
| | | | 204/290.15 |

FOREIGN PATENT DOCUMENTS

| | | |
|---|---|---|
| JP | 2008-001932 A | 1/2008 |
| KR | 10-2006-0051632 A | 5/2006 |
| KR | 10-2006-0058099 A | 5/2006 |
| KR | 10-2011-0073461 A | 6/2011 |

\* cited by examiner

DIAMOND ELECTRODE AND METHOD OF MANUFACTURING THE SAME

BACKGROUND

1. Technical Field

The present invention relates to a diamond electrode and a method of manufacturing the same and more particularly, to a diamond electrode for commercial use and a method of manufacturing the same by chemical vapor deposition (CVD).

2. Description of the Related Art

Known methods of forming an electrically conductive diamond layer by a chemical vapor deposition (CVD) process include methods based on hot-filament CVD, microwave plasma CVD, etc.

Pure diamond is a semiconductor having a band gap of 5.2 eV, and cannot be used as an electrode because it has little or no electrical conductivity. However, when a very small amount of boron (B) or phosphorus (P) is added during deposition of a diamond layer, an electrically conductive diamond layer is formed which can be used as an electrode. In recent years, boron-doped diamond (BDD) electrodes have been mainly used.

BDD electrodes have a large potential window and a high overvoltage for oxygen evolution as compared to other electrodes, and thus are very useful in the field of electrochemical water treatment. More specifically, BDD electrodes generate significantly large amounts of hydroxyl radicals (OH) and ozone ($O_3$) on the electrode surface as compared to insoluble electrodes called DSA (Dimensionally Stable Anode) electrodes, and thus are very useful as electrodes for water treatment.

Furthermore, when BDD electrodes are used as electrodes for water treatment, oxidizing agents such as hydroxyl radicals (OH), ozone ($O_3$) and hydrogen peroxide ($H_2O_2$) are produced, and potent oxidizing agents such as hypochlorite ions ($OCl^-$) are generated in an electrolyte containing chlorine ($Cl_2$). Accordingly, BDD electrodes can be used in the fields of electrochemical wastewater treatment, electrochemical water purification, ballast water treatment, etc.

Meanwhile, most BDD electrodes have shortcomings in that a pinhole may be present during deposition of the electrode layer, as during deposition of other layers, and the adhesion of the electrode to a substrate is reduced due to the stress of the deposited layer. Furthermore, when an amorphous carbon or graphite-like layer is formed, it has a short life span in an electrolytic environment. Moreover, the life span of the BDD electrodes may further be shortened due to the peeling of the layer either by heat generated in the electrode during the progression of an electrolytic process or the temperature of an electrolyte and chemical corrosion.

Conventionally, a method of fluorinating the surface of a substrate in order to eliminate defects, such as pinholes in a formed BDD electrode (Patent Document 1), was suggested. However, this method has disadvantages in that since the fluorination process is added, the time it takes to manufacture the BDD electrode increases to reduce productivity, and additional costs are incurred, thereby limiting the commercial use of the BDD electrode.

In addition, conventionally, there was suggested a method of forming a plurality of diamond layers having different properties, wherein a diamond layer forming the outermost surface layer of the plurality of diamond layers was formed to a thickness of 20 μm or more (see Patent Document 2). According to the disclosure of Patent Document 2, when a relatively thick diamond layer is applied, a problem may arise in that the diamond layer is peeled off due to tensile stress. To solve this problem, there was suggested a method in which a layer is also formed on the opposite surface of the substrate. However, this method has also a problem in that since the rate at which a BDD electrode layer is formed by the CVD process is only 0.1-0.7 μm/hr, the layer formation process is required to be carried out for about 100 hours in order to form the layer to a thickness of 20 μm or more.

In an attempt to overcome the above-described problems, a method was suggested in which a low-quality diamond layer was formed in the initial stage and a high-quality diamond layer was formed only in the outermost surface layer. However, this method is difficult to apply in practice because the rate at which a BDD electrode layer is deposited by a conventional CVD process is only 0.1-0.7 μm/hr and, thus, the layer deposition time is excessively long. Although the layer formation rate is somewhat proportional to the total amount of gases introduced, a method capable of forming a layer at a rate of several micrometers (μm) per hour is not yet known. In addition, the above-described method of forming a high-quality diamond layer only in the outermost surface layer still poses problems when it is commercially used.

RELATED ART DOCUMENTS

Patent Documents

Patent Document 1: Korean Unexamined Patent Application Publication No. 10-2006-0051632 (published on May 19, 2006);

Patent Document 2: Korean Unexamined Patent Application Publication No. 10-2011-0073461 (published on Jun. 29, 2011).

SUMMARY

Accordingly, the present invention has been made keeping in mind the above problems occurring in the prior art, and an object of the present invention is to provide a method of manufacturing a diamond electrode, which can manufacture a diamond electrode having excellent properties and a long life span by using a chemical vapor deposition (CVD) process and controlling a process of forming an electrically conductive diamond layer on a niobium (Nb) substrate.

Another object of the present invention is to provide a diamond electrode manufactured by the above manufacturing method.

To achieve the above objects, in accordance with one aspect of the present invention, there is provided a method of manufacturing a diamond electrode, the method including: introducing a carbon source gas into a chamber to form a carbide layer on the surface of a substrate immediately before forming an electrically conductive diamond layer; and forming electrically conductive diamond layers to a predetermined thickness by at least two separate processes while controlling the size of diamond crystals by controlling the ratio of hydrogen gas, carbon source gas and boron source gas introduced.

In accordance with another aspect of the present invention, there is provided a diamond electrode including: a substrate; a carbide layer on the substrate; a first electrically conductive diamond layer on the carbide layer; and a second electrically conductive diamond layer on the first electrically conductive diamond layer, the second electrically conductive diamond layer having the same properties as those of the first electrically conductive diamond layer.

In accordance with still another aspect of the present invention, there is provided a diamond electrode including: a niobium substrate having roughness; a niobium carbide layer on the substrate; a first electrically conductive diamond layer on the niobium carbide layer; a pinhole in the first electrically conductive diamond layer; and a second electrically conductive diamond layer on the first electrically conductive diamond layer and the pinhole.

In an embodiment, the first electrically conductive diamond layer may have a thickness of 2 μm or less, preferably 1-2 μm.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION

Figure 1:
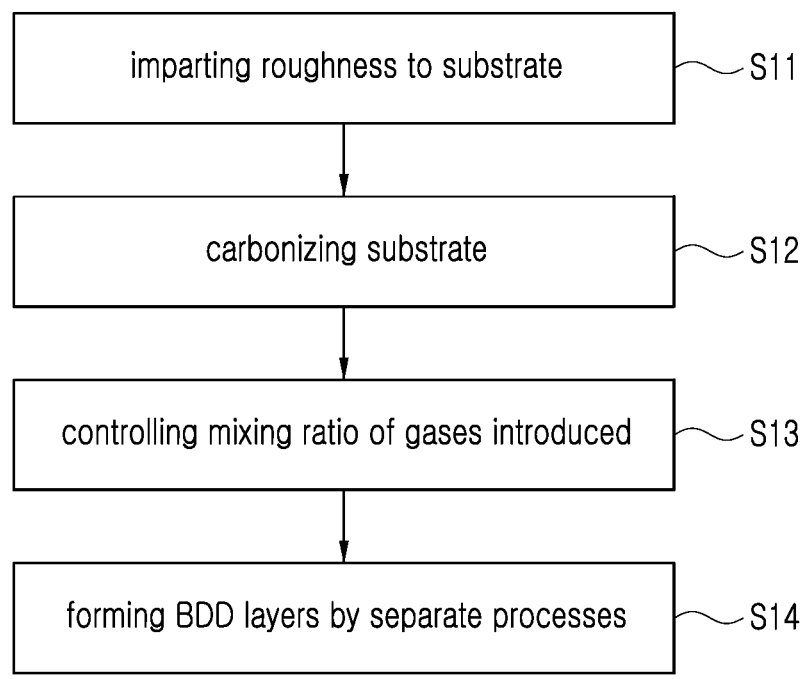
FIG. 1 is a flow chart showing a method of manufacturing a diamond electrode according to an embodiment of the present invention.

Embodiments of the present invention will be described in detail below with reference to the accompanying drawings FIG. 1 is a flow chart showing a method of manufacturing a diamond electrode according to an embodiment of the present invention.

Referring to FIG. 1, a method of manufacturing a diamond electrode according to this embodiment includes: step S11 of imparting roughness to a substrate; step S12 of carbonizing the substrate; step S13 of controlling the mixing ratio of introduced gases; and step S14 of forming electrically conductive diamond layers by separate processes.

The individual steps of the manufacturing method will now be described in detail.

Step S11 of Imparting Roughness to Substrate

Generally, a process of imparting roughness to the surface of a substrate by sanding the substrate or etching the substrate with acid is widely used as a technique for enhancing the adhesion between the substrate and a thin coating layer. In the case of all insoluble electrodes that are currently supplied, roughness is imparted to the substrate surface.

More specifically, in the case of boron-doped diamond (BDD) electrodes, the process of imparting roughness to a substrate surface is significant in terms of not only enhancing the adhesion between the substrate and the electrode layer but also ensuring the active area of the electrode in an electrolytic process.

Preceding studies report that the active area of a Ti/PbO$_2$ electrode is 85% of a simple area for which roughness has not been taken into consideration, and the active area of a BDD electrode is 15-26% of the simple area. In addition, the studies report that generation of oxidizing agents, such as hydroxyl radicals (OH) and ozone (O$_3$), differs between the two electrodes. This difference can be attributable to the active areas of the electrodes (see Seoul National University Ph.D. Dissertation by Soo-Jin Shim, "Characteristics of a lead dioxide electrode that influences the generation of oxidizing agents in an electrochemical water treatment process", 2013).

In an example of the present invention, BDD electrodes were manufactured on substrates sanded using commercially available #150 alumina (Brown Aluminum Oxide; grain size: 106-75 μm) and #16 alumina (grain size: 1,400-1,180 μm) and an unsanded substrate, and the life spans thereof were evaluated.

Table 1 below shows the results of evaluating the life spans based on whether the substrate was sanded, without taking into consideration other parameters of the BDD manufacturing process designed in this example:

TABLE 1

|  | First test | Second test | Third test | Average life span |
|---|---|---|---|---|
| Example (#150 sanded BDD) | 114.2 hr | 119.5 hr | 116.5 hr | 116.7 hr |
| Example (#16 sanded BDD) | 87.6 hr | 85.3 hr | 93.2 hr | 88.7 hr |
| Comparative Example (unsanded BDD) | 66.3 hr | 71.7 hr | 68.7 hr | 68.9 hr |

The life span evaluation results shown in Table 1 were obtained under the following test conditions: a mixture obtained by mixing 99.5% acetonitrile (CH$_3$CN), 98% sulfuric acid (H$_2$SO$_4$) and distilled water at a ratio of 1 l:3 1:27 l was used as an electrolyte solution; current density was 100 A/dm$^2$; a positive electrode was #150 sanded BDD, #16 sanded BDD or unsanded BDD; a negative electrode was a platinum (Pt) electrode; the distance between the electrodes was maintained at 3 mm; and each of the electrodes had a size of 3 mm×5 mm.

The determination of the life span was based on voltage rise, and it was determined that the electrodes has had it when the voltage reached 7 V during electrolysis, in view of the fact that the initial voltage was 5.0-5.2 V.

As can be seen from Table 1 above, when roughness was imparted to the substrate, the life span was increased by 28-69% compared to the left span when roughness was not imparted to the substrate. In addition, the results of tests for sanding media having various grain sizes indicated that the grain size of the sanding media was preferably 75-200 μm, and more preferably 100-150 μm.

Step S12 of Carbonizing Substrate

The substrate of an electrode may be corroded by factors such as chemical attack or deterioration, and a thin layer may be damaged or consumed, thereby reducing the life span of the electrode. In addition, when a pinhole is present during the layer formation process, the substrate is exposed directly to an electrolyte to accelerate the reduction in the life span of the electrode, and the adhesion between the substrate and a thin layer is also reduced to adversely affect the life span of the electrode. In view of such facts, attempts were made to use a method of forming an intermediate layer in insoluble electrodes to thereby prevent the substrate from being exposed directly to the electrolyte or increase the adhesion between the substrate and a thin layer (JP 60-21232 B, JP 2761751 B, US 2009/0246410 A1, etc.). However, these attempts are related mainly to platinum-group metal oxide electrodes (DSA electrodes such as Ti/IrO$_2$ electrodes), and are difficult to apply to the formation of BDD electrode layers.

Meanwhile, in a method of manufacturing a BDD electrode by a hot-filament chemical vapor deposition (HFCVD) process according to an embodiment of the present invention, methane (CH$_4$), TMB (trimethylboron, 0.1% C$_3$H$_9$B/H$_2$ bal) and hydrogen (H$_2$) are used as a carbon source, a boron source and a balance gas, respectively, thereby improving the performance of the BDD electrode.

Specifically, as known from the art, after completion of preparation for the formation of an electrically conductive diamond layer, a process of heating filaments to thermally decompose carbon and forming the decomposed carbon into a diamond-like crystal structure is performed. In this process, boron source gas may be injected to dope about 100-10,000 ppm of boron, thereby forming an electrically conductive diamond layer. In view of this fact, in the present embodiment, a process of introducing hydrogen and methane gas to form a niobium carbide layer on a niobium substrate (11 in FIG. 2) is performed before a process of heating filaments to a suitable temperature to reach process conditions in which an electrically conductive diamond layer can be formed.

If carbide is deposited or coated on a substrate, the effect of preventing the substrate from being exposed directly to an electrolyte is obtained and, at the same time, the effect of increasing the adhesion between the substrate and the diamond layer by the action of the carbide is achieved.

In the embodiment of the present invention, the process of forming the carbide layer is performed for 10-30 minutes so that a niobium carbide layer will be formed to a thickness of about 100 nm, but is not limited thereto. In addition, in this embodiment, a niobium substrate is used as the substrate, but is not limited thereto. Substrates made of other materials may also be used.

Step S13 of Controlling Mixing Ratio of Gases Introduced

In the present embodiment, methane is used as a carbon source, TMB is used as a boron source, and hydrogen is used as a balance gas. According to preceding studies, it is known that the mixing ratio of these gases and the amount of gases introduced influence the characteristics of a BDD electrode and the layer formation rate. Accordingly, in the present embodiment, the ratio of hydrogen:methane:TMB introduced is maintained at 100:0.5-2.5:3-5. More preferably, the ratio is 100:1.5:4.

Step S14 of Forming Electrically Conductive Diamond Layers by Separate Processes Although the thickness of a BDD electrode layer can be relatively freely controlled, a BDD electrode having a thickness of 3-5 µm is generally manufactured. In view of the fact that the layer formation rate for the BDD electrode is generally 0.1-0.7 µm/hr, it can be seen that a layer formation time of about 10 hours is required. According to preceding studies, the grain size and the layer formation rate can vary depending on the mixing ratio of gases introduced and the amount of gases introduced. In addition, a pinhole is almost inevitably present during the formation of the electrode layer, and as the electrode layer becomes thicker, the adhesion thereof can be reduced due to tensile stress, or the peeling of the layer may occur. In view of these facts, in the present embodiment, an electrically conductive diamond layer having a thickness of 2 µm or less or about 2 µm is first formed for 5 hours while the mixing ratio of gases that are introduced in step (S13) is maintained, and then another electrically conductive diamond layer having a thickness of 2 µm or less or about 2 µm is formed for additional 5 hours, thereby forming electrically conductive diamond layers by separate processes.

The influence of the tensile stress of the thin layer occurs when the thickness of the thin layer reaches 2-3 µm. In view of this fact, in the present embodiment, two or more separate processes for forming electrically conductive diamond layers are performed by forming a layer (2 µm or less, preferably 1-2 µm) for 2 hours or more and then forming another layer until the desired thickness is reached.

According to preceding studies, the thickness of a BDD electrode layer used in an experiment is about 3-5 µm, and the electrode exhibits sufficient electrode performance at that thickness. In view of this fact, in the present embodiment, a layer formation process for a certain time (for example, 5 hours) is performed two or more times to thereby manufacture a BDD layer having the above-described thickness. When such separate processes for layer formation are performed, the peeling of the layer by tensile stress can be alleviated, and the pinhole formed during the formation of the first BDD layer (13 in FIG. 2) can be eliminated during the formation of the second BDD layer (15 in FIG. 2) so that the direct contact between an electrolyte and the substrate can be minimized, thereby manufacturing a BDD electrode having a long life span.

Figure 2:
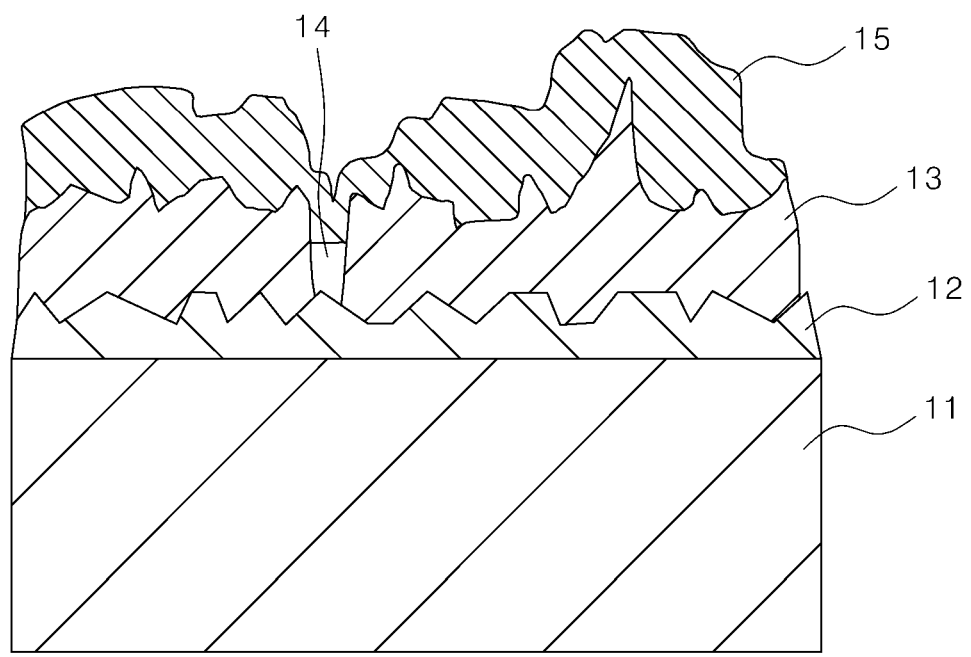
FIG. 2 is a sectional view of a diamond electrode manufactured by the diamond electrode manufacturing method shown in FIG. 1.

FIG. 2 is a sectional view of a diamond electrode manufactured by the diamond electrode manufacturing method shown in FIG. 1.

Referring to FIG. 2, the diamond electrode according to the present embodiment includes: a substrate 11; a niobium carbide layer 12 on the substrate 11; a first electrically conductive diamond layer 13 on the niobium carbide layer 12; a pinhole 14 in the first electrically conductive diamond layer 13; and a second electrically conductive diamond layer 15 on the first electrically conductive diamond layer 13 and the pinhole 14.

The substrate 11 may be a niobium substrate having roughness.

The thickness of the first electrically conductive diamond layer 13 is 2 µm or less, and preferably 1-2 µm. This thickness is the average diameter of the first electrically conductive diamond layer 13.

Example 1

Hereinafter, a method of manufacturing the diamond electrode shown in FIG. 2 will be described in detail. In this example, both surfaces of a niobium substrate were sanded using #150 alumina (Brown Aluminum Oxide; grain size: 106-75 µm). The sanded substrate was ultrasonically cleaned with acetone, and then ultrasonically cleaned with alcohol. The niobium substrate had a size of 3 mm×5 mm×1 mm (W×L×T). The prepared substrate was coated with diamond nuclei by dipping it in an alcohol solution containing diamond powder dispersed therein.

Thereafter, the substrate was placed in a vacuum chamber which was then evacuated to a pressure of $7-9 \times 10^{-3}$ torr using a rotary pump. Then, tungsten filaments were heated slowly to a temperature of 2,100-2,700° C.

Thereafter, at the time point at which the temperature of a thermocouple disposed at the side of the substrate increased to 600-700° C., hydrogen gas and methane gas were introduced into the chamber while the mixing ratio thereof was controlled to a ratio of 100:1.5 using a mass flow controller (MFC), thereby forming niobium carbide (NbC) on the substrate surface. In this case, the chamber was maintained under a vacuum of 50 torr.

After the above process was performed for 20 minutes, supply voltage was set so that the temperature of a thermocouple disposed at the side of the substrate reached 750-800° C. While this temperature was maintained, the flow rates of gases introduced were controlled using MFC so that the mixing ratio of hydrogen:methane:TMB gas was 100:1.5:4.

A first BDD layer was deposited through the above-described process. After the BDD layer deposition process time (5 hours), deposition of the first BDD layer was stopped. In this case, the substrate was transferred from the vacuum chamber into an atmospheric chamber.

Thereafter, the substrate having the first BDD layer deposited thereon was placed again in the vacuum chamber. The evacuation process and the filament heating process were performed in the same manner as described above in connection with the formation of the first BDD layer, and a subsequent deposition process was performed for 5 hours in the same manner as described above with the first BDD layer, thereby forming a second BDD layer.

The life spans of the electrically conductive diamond electrode manufactured in the above example, an Nb/BDD electrode (Kondias), and a Ti/IrO$_2$ electrode, i.e., a conventional insoluble electrode, were comparatively evaluated. The evaluation of the life spans were performed using an accelerated life testing method under the following conditions:

electrolyte solution: electrolyte solution obtained by mixing 99.5% acetonitrile (CH$_3$CN), 98% sulfuric acid (H$_2$SO$_4$) and distilled water at a ratio of 1 1:3 1:27 1;

current density: 100 A/dm$^2$ (reaction area: 0.00785 dm$^2$, diameter: 10 mm);

electrolytic temperature: 30° C.

negative electrode: zirconium (Zr) plate.

The determination of the life spans were performed based on rises in voltage, and it was determined that the electrodes ended their life spans when the voltage reached 7 V during electrolysis, in view of the fact that the initial voltage was 5.0-5.2 V.

The results of evaluation of the life span are summarized in Table 2 below:

TABLE 2

| | First test | Second test | Third test | Average life span |
|---|---|---|---|---|
| Example | 158.7 hr | 134.4 hr | 161.3 hr | 151.5 hr |
| Comparative Example 1 (purchased BDD) | 109.4 hr | 112.2 hr | 93.8 hr | 105.1 hr |
| Comparative Example 2 (IrO$_2$ 3 μm) | 13.2 hr | 16.5 hr | 16.1 hr | 15.3 hr |
| Comparative Example 3 (IrO$_2$ 6 μm) | 38.3 hr | 35.4 hr | 39.2 hr | 37.6 hr |

In Table 2 above, the thickness of the BDD layer of this example was measured to be 3.8-4.7 μm, and the thickness of the BDD layer of Comparative Example 1 was measured to be 4.2-5.1 μm. In addition, the initial voltage of the BDD electrode of this example was 5.1-5.2 V; the initial voltage of the BDD electrode of Comparative Example 1 was 5.0-5.2 V; the initial voltage of the IrO$_2$ electrode of Comparative Example 2 was 4.6-4.7 V; and the initial voltage of the IrO$_2$ electrode of Comparative Example 3 was 4.0-4.2 V.

As can be seen from the life span evaluation results in Table 2 above, the life span of the BDD electrode according to this example was increased by 44% or more compared to that of the conventional BDD electrode. This is because the formation of the niobium carbide layer on the substrate surface, the mixing ratio of hydrogen, methane and TMB gases, and the deposition of the BDD layers by separate processes, acted together. Accordingly, according to this example, an electrically conductive diamond electrode having a relatively good endurance life can be manufactured.

Meanwhile, in the process in which the voltage rose, the BDD electrode of this example showed a voltage rise of 10% after 139-144 hours and a voltage rise of 20% after 148-153 hours. However, the BDD electrode of Comparative Example 1 showed a voltage rise of 10% after 75-81 hours and a voltage rise of 20% after 77-89 hours. As can be seen from these results, the BDD electrode of this example is more stable in electrolytic processes, and the slope of the voltage rise curve is relatively gentle, even though there is a slight voltage rise. This indicates that the progression of damage to the BDD layer is relatively slow.

As described above, it can be seen that the life span of the BDD electrode of this example was greatly increased. In order to examine whether there is a problem in the performance of the electrode having an increased life span, comparative evaluation was performed using a method of measuring the efficiency of generation of hypochlorous acid, which is the easiest method. In a test for comparative evaluation, hypochlorous acid was produced for 3 minutes using an aqueous solution of 3% sodium chloride (NaCl), and the efficiency of the production was measured by iodometric titration. Conventional insoluble electrodes show an efficiency of 85% or higher for new products and an efficiency of 91-92% for some products, even though the efficiency differs between manufacturing companies. The test was performed under the following conditions:

electrolyte solution: aqueous solution of 3% sodium chloride (NaCl)

current density: 15 A/dm$^2$ distance between electrodes: 3 mm negative electrode: titanium (Ti) mesh.

The results of comparatively evaluating the efficiency of generation of an oxidizing agent are summarized in Table 3 below:

TABLE 3

| | First test | Second test | Third test | Average efficiency |
|---|---|---|---|---|
| Example | 96.5% | 98.6% | 98.6% | 97.9% |
| Comparative Example 1 (purchased BDD) | 97.3% | 98.4% | 98.3% | 98.0% |
| Comparative Example 2 (IrO$_2$ electrode) | 84.3% | 82.7% | 82.5% | 83.2% |
| Comparative Example 3 (RuO$_2$ electrode) | 88.2% | 93.7% | 90.4% | 90.8% |
| Comparative Example 4 (Pt electrode) | 58.3% | 56.5% | 52.9% | 55.7% |

As can be seen from Table 3 above, the BDD electrode of this example showed significantly high efficiency compared to the conventional insoluble electrodes. This is believed to be because ozone (O$_3$) was produced together with hypochlorous acid when the BDD electrode of this example was used. When the BDD electrode of this example is used in the water treatment field, the BDD electrode can be said to be the most effective electrode that generates oxidizing agents because hypochlorous acid and ozone are all potent oxidizing agents.

Meanwhile, it was found that the efficiency of generation of oxidizing agents is almost similar between the electrode of this example and the electrode of Comparative Example 1. This confirms that the BDD electrode of this example can stand comparison with the conventional expensive electrode of Comparative Example 1 in terms of the performance of generating oxidizing agents.

As described above, according to the present invention, there may be provided a method of manufacturing a diamond electrode, which can ensure a long electrode life span while maximizing the electrode characteristics regardless of the presence of a pinhole during the manufacture of the diamond electrode, and a diamond electrode manufactured by the method.

Although the preferred embodiments of the present invention have been disclosed for illustrative purposes, those skilled in the art will appreciate that various modifications, additions and substitutions are possible without departing from the scope and spirit of the invention as disclosed in the accompanying claims.

What is claimed is:

1. A method of manufacturing a diamond electrode, the method comprising:

sanding a surface of a substrate by alumina sanding media of which a grain size is 100 μm to 150 μm, and imparting roughness to the surface of the substrate;

forming a carbide layer on the surface of the substrate by introducing hydrogen and a carbon source gas into a vacuum chamber, wherein the forming of the carbide layer comprises forming a niobium carbide layer on a niobium substrate by introducing hydrogen and a carbon source gas in a mixing ratio of 100:1.5, the hydrogen and the carbon source gas being introduced at a time point at which a temperature of the surface of the substrate is increased to 600° C.~700° C., wherein the forming of the carbide layer is performed for 10-30 minutes such that the niobium carbide layer is formed to have a thickness smaller than 1 μm; then at a time point at which the temperature of the surface of the substrate is increased to a first temperature in a range of 750° C.~800° C., depositing a first boron-doped diamond layer directly on the carbide layer by hot-filament chemical vapor deposition (HFCVD) on the carbide layer by introducing methane ($CH_4$), TMB (trimethylboron, 0.1% $C_3H_9B$), and hydrogen ($H_2$) into the vacuum chamber in a first ratio of 0.5-2.5:3-5:100 (methane:TMB:hydrogen) for a first process time during which the temperature of the surface of the substrate is maintained as the first temperature;

after the first process time, stopping the depositing of the first boron-doped diamond layer, wherein the first boron-doped diamond layer deposited during the first process time has a thickness of 1-2 μm; then depositing a second boron-doped diamond layer directly on the first boron-doped diamond layer by hot-filament chemical vapor deposition (HFCVD) by introducing methane ($CH_4$), TMB (trimethylboron, 0.1% $C_3H_9B$), and hydrogen ($H_2$) into the vacuum chamber in a same ratio as the first ratio for a second process time during which the temperature of the surface of the substrate is maintained same as the first temperature;

after the second process time, stopping the depositing of the second boron-doped diamond layer, wherein the second boron-doped diamond layer deposited during the second process time has a thickness of 1-2 μm, wherein the first boron-doped diamond layer has a pinhole, and the second boron-doped diamond layer is deposited directly on the first boron-doped diamond layer to cover the pinhole, wherein the first boron-doped diamond layer has a first surface in contact with the carbide layer and a second surface opposite to the first surface, and the second boron-doped diamond layer covers and comes in direct contact with substantially the entire second surface of the first boron-doped diamond layer, wherein the first and second boron-doped diamond layers are deposited on the carbide layer, such that a thickness of a combination of the first boron-doped diamond layer and the second boron-doped diamond layer that covers the pinhole of the first boron-doped diamond layer is 3 to 5 μm.

2. The method of claim 1, wherein the ratio of methane:TMB:hydrogen during the depositing of the first boron-doped diamond layer is 1.5:4:100, and the ratio of methane:TMB:hydrogen during the depositing of the second boron-doped diamond layer is 1.5:4:100.

3. The method of claim 1, wherein the niobium carbide layer is formed to have a thickness of about 100 nm.

4. The method of claim 1, wherein further comprising:

depositing a third boron-doped diamond layer directly on the second boron-doped diamond layer by hot-filament chemical vapor deposition (HFCVD) by introducing methane ($CH_4$), TMB (trimethylboron, 0.1% $C_3H_9B$), and hydrogen ($H_2$) into the vacuum chamber in a same ratio as the first ratio for a third process time during which the temperature of the surface of the substrate is maintained same as the first temperature.

* * * * *